United States Patent [19]

Magni

[11] Patent Number: 5,660,316

[45] Date of Patent: Aug. 26, 1997

[54] METHOD AND APPARATUS FOR BONDING SEMICONDUCTOR ELECTRONIC DEVICES

[75] Inventor: Pierangelo Magni, Villasanta, Italy

[73] Assignee: SGS-Thomson Microelectronics S.r.l., Agrate Brianza, Italy

[21] Appl. No.: 413,993

[22] Filed: Mar. 30, 1995

[30] Foreign Application Priority Data

Mar. 31, 1994 [EP] European Pat. Off. ............ 94830155

[51] Int. Cl.⁶ ..................... B23K 20/10; B23K 31/02
[52] U.S. Cl. ................................. 228/1.1; 228/4.5
[58] Field of Search ................. 228/1.1, 4.5, 49.5

[56] References Cited

U.S. PATENT DOCUMENTS

| | | | |
|---|---|---|---|
| 4,838,472 | 6/1989 | Scavino | 228/4.5 |
| 5,158,223 | 10/1992 | Shimizu | 228/1.1 |
| 5,322,207 | 6/1994 | Fogal et al. | 228/4.5 |
| 5,340,011 | 8/1994 | Sanchez | 228/49.5 |

FOREIGN PATENT DOCUMENTS 60-154535  8/1985  Japan ..................... 228/4.5
62-193135  8/1987  Japan ..................... 228/4.5

*Primary Examiner*—P. Austin Bradley
*Assistant Examiner*—Jeffrey T. Knapp
*Attorney, Agent, or Firm*—Wolf, Greenfield & Sacks, PC; James H. Morris

[57] ABSTRACT

A method and apparatus for forming electric connections between predetermined bonding pads of semiconductor electronic devices and respective electric contact leads formed on a frame holding the devices in a tidy arrangement is available. The apparatus includes a supporting structure, a mechanism for advancing the frame along a longitudinal direction in a work plane on the supporting structure, a bonding head, and a high-precision X-Y table carrying the bonding head for accurately setting the bonding head in the work plane. The bonding apparatus further includes a carriage guided on the supporting structure for movement in a transverse direction to the longitudinal direction, the X-Y table being mounted on the carriage. The bonding head working range always spans a sufficiently large area for a single device, thereby enabling connections to be made even when the side-by-side devices are arranged in two or more rows.

28 Claims, 3 Drawing Sheets

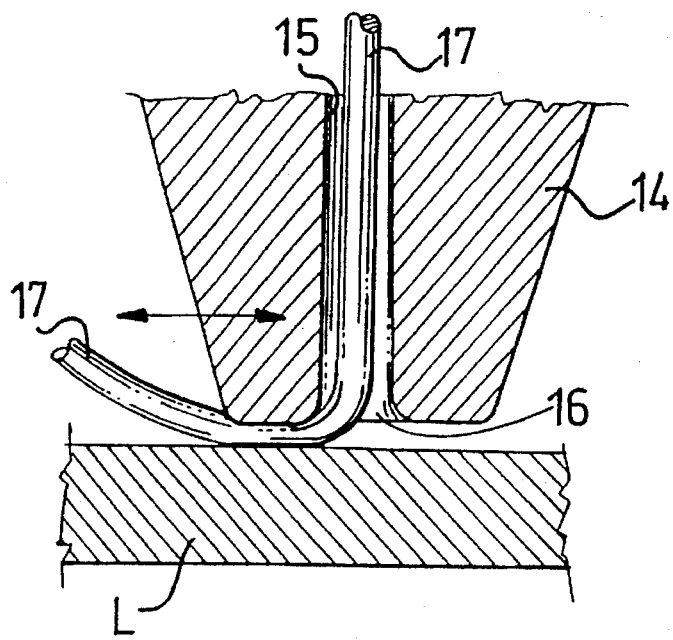
FIG. 6
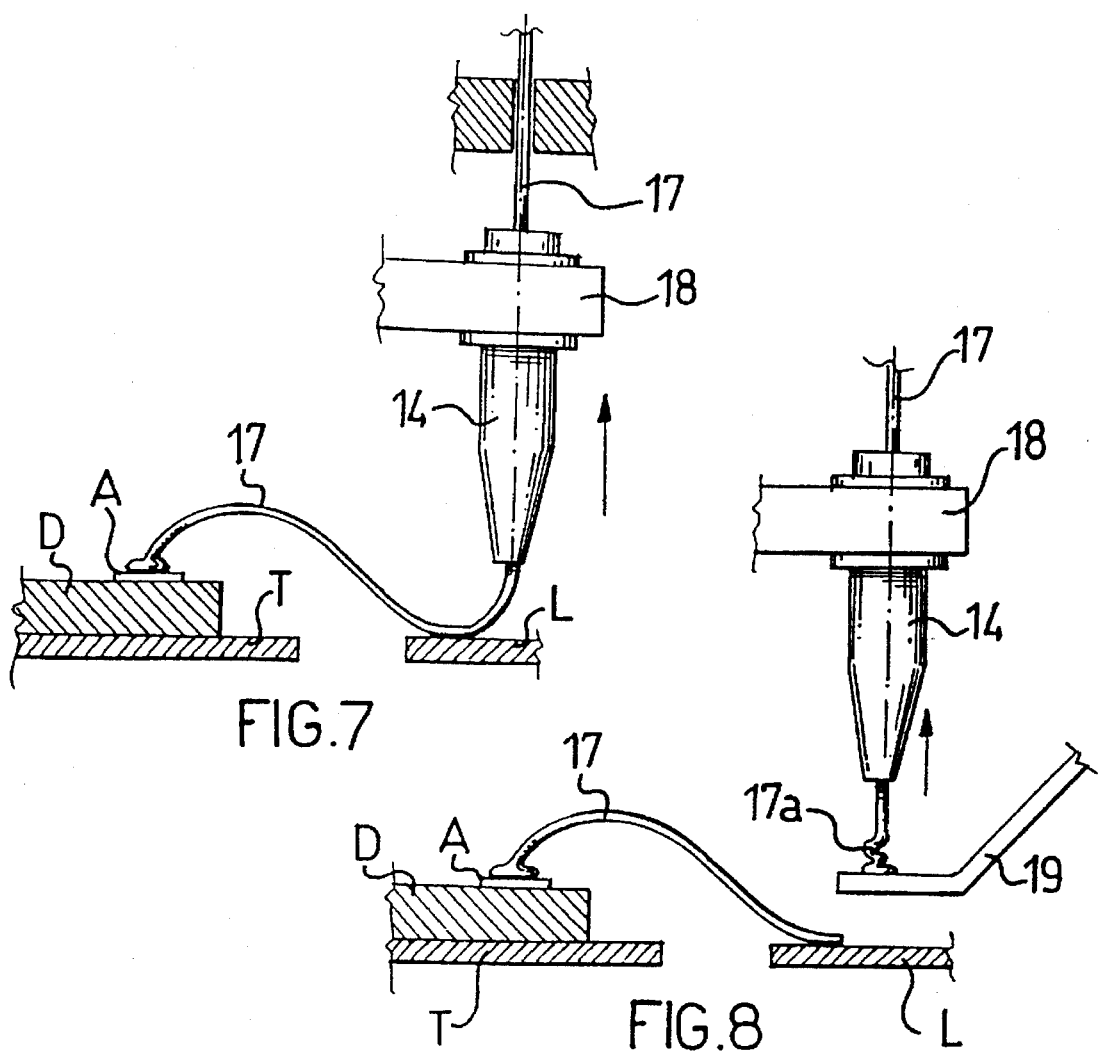
FIG. 7
FIG. 8

METHOD AND APPARATUS FOR BONDING SEMICONDUCTOR ELECTRONIC DEVICES

BACKGROUND OF THE INVENTION

1. Field of the Invention

This invention relates to a method and apparatus for forming electric connections between predetermined bonding pads of semiconductor electronic devices and respective electric contact leads formed on a frame in which the semiconductor electronic devices have been arranged.

2. Discussion of the Related Art

In the manufacture of semiconductor electronic devices, the electronic device proper (i.e., a piece of suitably doped silicon, sometimes referred to as a die) is provided with leads for setting up electric contacts. Each of the leads is connected electrically to a definite area of the silicon. To this end, the silicon piece is placed securely onto a very thin metal frame, which frame is, among others, formed with sections that are eventually to be fashioned (as by appropriate blanking) into the leads of the device. The electric connection between each of the leads and its corresponding silicon pad is made by depositing a wire conductor and bonding it to both the silicon and the lead. Typically, the bonding wire is made of gold, and bonding is a ultrasonic process.

The bonding operation, although conceptually simple, is made highly critical by the minute size of the connections to be formed and their large number; a typical semiconductor electronic device includes a few hundred connections spread over the perimeter of a square measuring less than two cm along each side. The acceptable margin for error is almost nil, because a single faulty bond out of the hundreds made on one device would turn the whole device into a reject. Further, the time to create all the bonds should be the shortest possible if large production volumes are sought.

Bonding is conventionally performed by a head mounted on an X-Y table, which is a mechanism that can be moved in a plane controllably along two spatial coordinates, X and Y. Tables are known which, while ensuring the necessary high degree of accuracy, can work at extremely fast rates, on the order of 100-200 ms per connection, including bonding to the silicon, depositing the wire, bonding to the lead, and cutting the wire. Tables of this type will be referred to as very high precision tables hereinafter.

Once the connections have been made on a semiconductor electronic device, the frame is indexed forward far enough to bring the next device on which connections are to be made within reach of the bonding head. The metal frame accommodates a set of identical electronic devices lined up one behind another. The frame may either be a definite length or in the form of a flexible strip, stored on a reel that is fed forward continuously and cut at intervals. Upon completion of the connections on a given number of the devices, the whole batch is transferred to the next processing step, wherein an insulating resin is poured over the devices to encapsulate the leads. The resin pouring step takes a fairly long time, for both pouring and curing the material, and is often found to be the bottleneck of the whole process. Therefore, frames have been developed wherein the devices can be lined up into two columns instead of one.

If the device size is very small (less than one centimeter), conventional machines can handle pairs of side-by-side devices without undue difficulty. With larger size devices, however, the processing head must be slowed down because the larger working area to be spanned may degrade accuracy to an unacceptable extent. This reduced speed frequently is enough to thwart any advantage gained in the pouring step, and accordingly many conventional systems do not use the paired device setup.

SUMMARY OF THE INVENTION

It is an object of the present to enable several electronic devices, laid side-by-side in a frame, to be bonded while retaining a processing rate and a degree of accuracy which are comparable with those to be obtained when the devices are arranged in a single column.

The foregoing object is achieved in accordance with one illustrative embodiment of the invention, in which bonding apparatus for forming electric connections between predetermined bonding pads of semiconductor electronic devices and respective contact leads formed on a frame in which the devices have been tidily arranged is provided. The bonding apparatus includes a supporting structure, means for advancing the frame along a longitudinal direction in a work plane on the supporting structure, a bonding head, a high-precision X-Y table carrying the bonding head for accurately setting the bonding head in the work plane, and a carriage driven in a guided fashion across the supporting structure in a transverse direction to the longitudinal direction, the X-Y table being mounted on the carriage.

In another illustrative embodiment of the invention, the bonding head operates at all times within a working range sized for a single device. To make the connections on plural electronic devices laid side-by-side, the bonding head is bodily shifted with the carriage such that its working range will encompass the area occupied by a device to be bonded, each time. As may be appreciated, moving the carriage to shift the X-Y table, and the working range of the bonding head with it, is not so critical as expanding the range of the X-Y table itself, a comparatively coarse setting being all that is required.

To maximize the working range in the transverse direction, and hence the number of the side-by-side devices that can be processed, the carriage is suspended in accordance with another illustrative embodiment of the invention, preferably from a portion of the supporting structure which overlies the frame. The X-Y table may in turn be suspended from the carriage. In this way, a compact construction can be provided, in the sense that the bonding head need not include extra-long reach arms which might create problems from mechanical inertia.

The bonding head may be any of several types. In one embodiment of the invention, it includes a tubular bond bit, a feed channel inside the bond bit, a bonding wire to be fed through the feed channel, elevating means for shifting the bond bit vertically and pressing it onto the bonding pads and the leads, and means for imparting ultrasonic vibrations to the bond bit.

The elevating means may also be any of several types. In one embodiment of the invention, the evaluating means may comprise a swing arm pivoted to the bonding head and movable in a vertical plane, the bond bit being mounted on one end of the swing arm.

BRIEF DESCRIPTION OF THE DRAWINGS

Further features and advantages of the invention will be readily apparent from the following description of an illustrative embodiment thereof, to be taken in conjunction with the accompanying drawings, in which:

FIGS. 2 to 8 illustrate, in schematic form, the successive steps of depositing a wire conductor.

DETAILED DESCRIPTION

Figure 1:
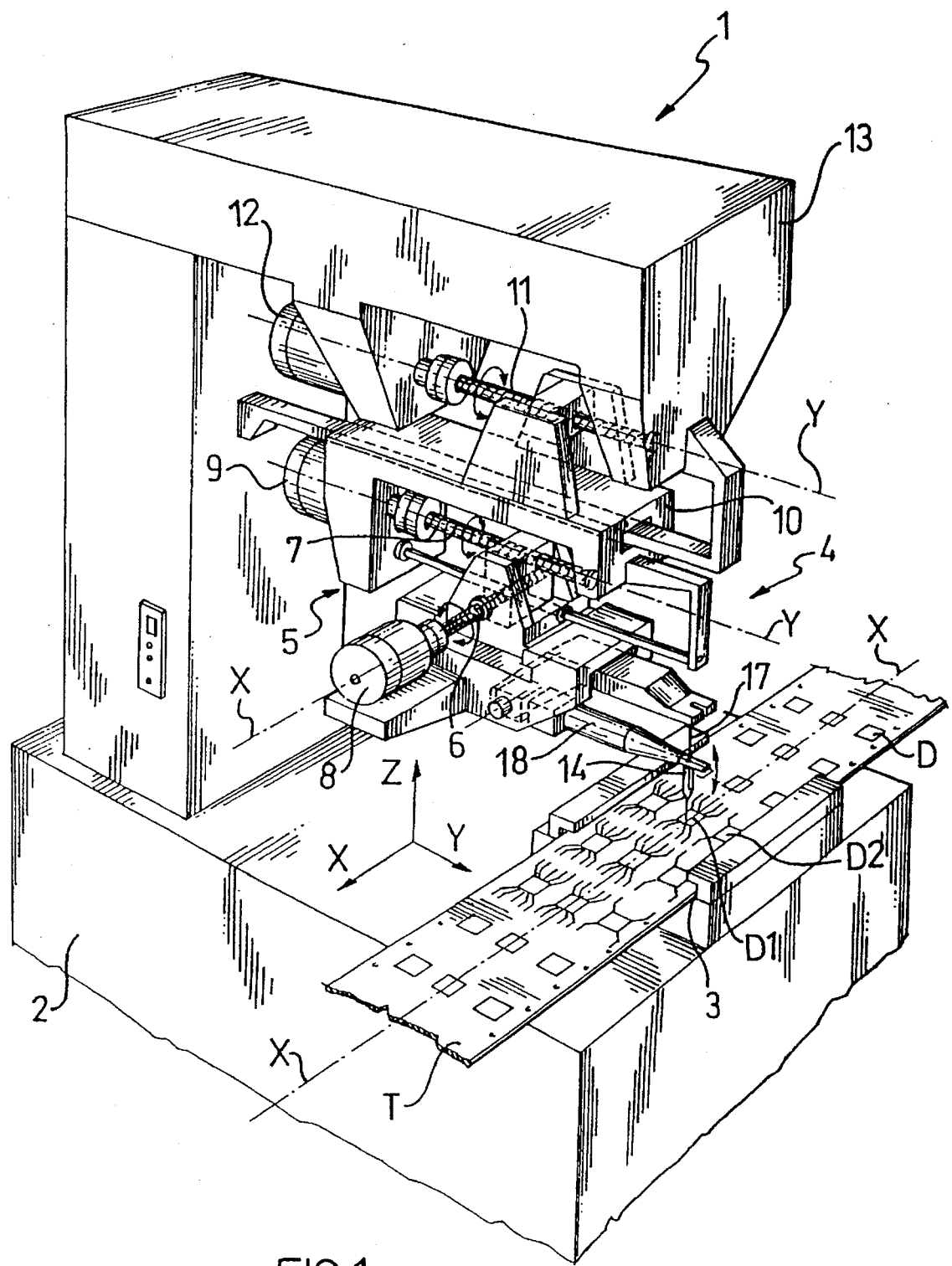
FIG. 1 is a perspective view of an apparatus according to the invention.

In the figures, generally shown at 1 is a bonding apparatus which comprises a supporting structure 2 having a work surface 3 formed thereon. Three orthogonal axes X, Y and Z are defined on the structure 2, with the work surface extending along the X and Y axes and Z representing the vertical direction. Located on the work surface 3 is a frame T on which electronic devices D are arranged. The electronic devices D are tidily arranged on the frame T, into columns lying along the X direction and rows lying along the Y direction. The frame T is advanced across the work surface 3 along the X direction by conventional means, not shown. The X direction will be also referred to herein as the longitudinal direction, and the Y direction as the transverse direction, relative to the direction of advance of the frame T.

The structure 2 carries, located above the work surface 3, a bonding head, generally denoted by 4, which is mounted on an X-Y table 5. The X-Y table 5 is a very high-precision one which includes drive means for movement in the X and Y directions; in the example shown, such means comprise respective worm screw drives 6 and 7 rotated by respective electric motors 8 and 9. The X-Y table 5 is not described nor illustrated in further detail because it is conventional.

The X-Y table 5 is not mounted directly on the structure 2, but rather, is mounted on a carriage 10 which is guided for movement along the axis Y on the structure 2. For this purpose, the carriage 10 is provided with a worm screw mechanism I1 and an electric motor 12. The carriage 10 is mounted under a bracket 13 of the structure 2, and the X-Y table 5 is mounted under the carriage 10. Thus, the bonding head 4 is substantially suspended.

The bonding head 4 further comprises, in a conventional manner, a substantially tubular bond bit 14 having a feed channel 15 formed therein which is terminated with an outlet 16. A bonding wire 17 of gold is fed through the channel 15. The bond bit 14 is mounted on the top end of a swing arm 18 pivoted to the bonding head 4 and movable in a vertical plane. An elevating means (not shown) drives the arm 18 to produce movement of the bond bit 14 substantially in the same direction as the Z axis. Another means (not shown) is provided on the bonding head 4 for imparting ultrasonic vibration to the bond bit 14 which causes the wire 17 to form a bonded joint.

The operation of the apparatus 1 proceeds in a cyclic manner through the steps described herein below. With the frame T held stationary on the work surface 3, and the carriage 10 stationary on the structure 2, the working range of the bonding head 4 encompasses a selected electronic device D1 on which bonds are to be carried out. The X-Y table 5 moves the bonding head 4 horizontally in the X and Y axes, whereas the elevating means moves the bond bit 14 vertically in the Z axis on the bonding head 4.

On completion of all the bonded connections on the device D1, the motor 12 is operated to drive the carriage 10 such that the working range of the bonding head 4 can be shifted to span a device D2 located in the same row as the device D1 but in a different column. Once the bonded connections on the device D2 are completed, the bonding head is moved to the next device, and so on until a whole row of devices D is served. Thereafter, the frame T is advanced to bring under another row.

Figure 2:
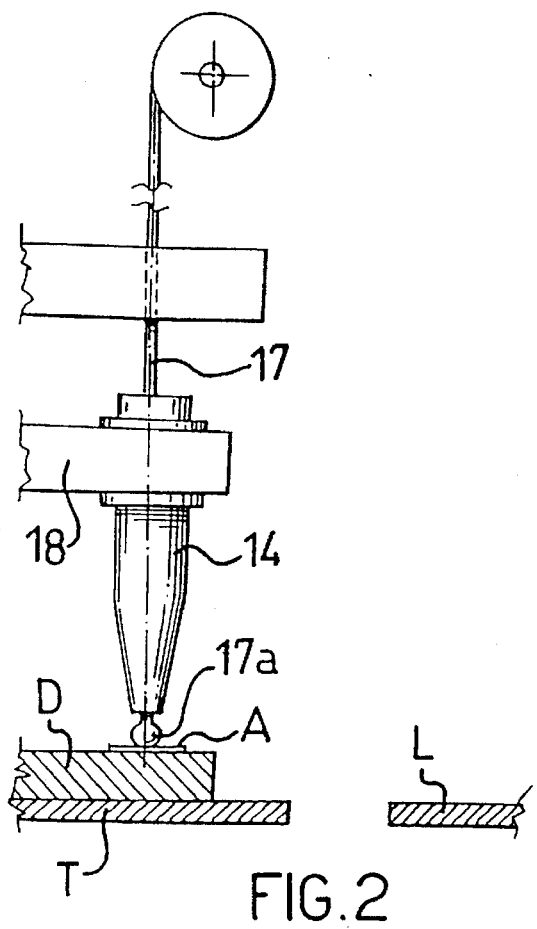
Figure 3:
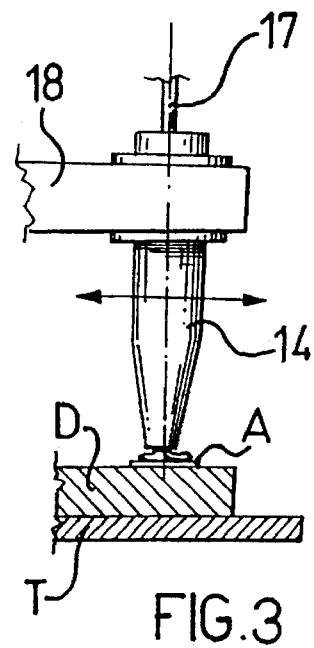
Figure 4:
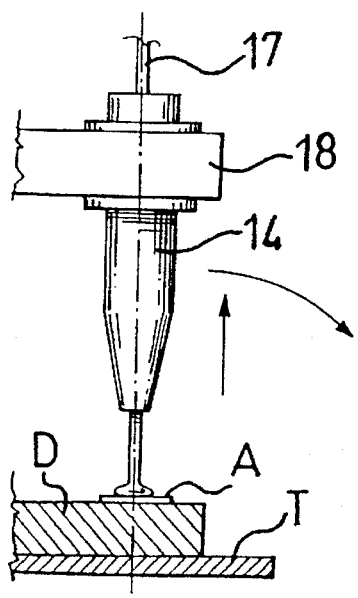
Figure 5:
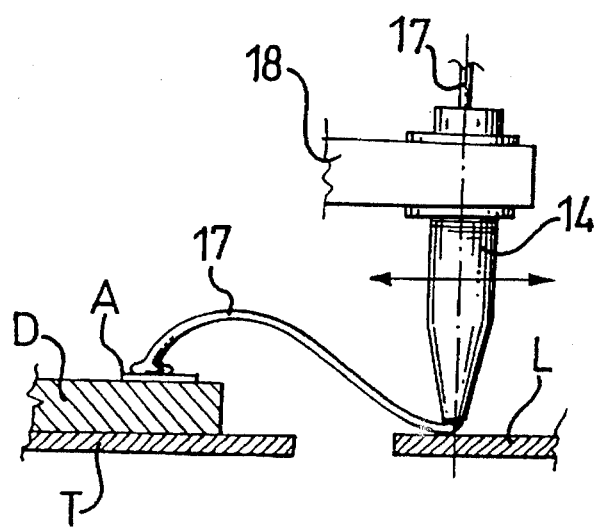

The bonding operations are performed on a single device D in a conventional way. However, such operations are briefly reviewed for clarity, making reference to FIGS. 2 to 8 of the drawings. During a first step (FIG. 2), the wire 17, being passed through the bond bit 14, is formed with an end enlargement, shown at 17a, and brought to a bonding pad A provided on the electronic device D. The enlargement 17a is then pressed (FIG. 3) onto the bonding pad A, while the bond bit 14 is imparted ultrasonic vibration, whereby the wire 17 becomes bonded to the pad A. The bond bit is then raised while letting the wire 17, still attached to the device D, run free through the feed channel 15 (FIG. 4). Again with the wire 17 movement unrestrained, the X-Y table 5 is then moved to bring (FIG. 5) the bond bit 14 above a lead L to which the bonded pad A is to be connected electrically. The bond bit 14 is then lowered and pressed onto the lead L (FIG. 6). The combined action of the pressure on the wire 17 from the outlet 16 and of an ultrasonic vibration imparted to the bond bit 14 will produce the bond. Then, the bond bit 14 is raised somewhat with the wire 17, now attached to the device D, free to run through the feed channel 15 (FIG. 7), whereafter the wire 17 mobility is checked and, consequently, the wire itself will be pulled apart at the location of the bonded joint just completed. Finally (FIG. 8), the bond bit 14 with the wire 17 leftover from the pulling apart is pressed onto a special tool 19 to reform the enlargement 17a and a fresh bonding cycle commenced.

As previously mentioned, the above cycle is completed in a very short time, usually within 100 to 200 ms. Thus, the drive to the X-Y table 5 is a highly critical one and the reason why it has been heretofore impossible to work on frames with more than one column of side-by-side electronic devices, or at best on no more than two columns where the size of the devices was so small that they presented a small work area.

In accordance with the present invention, on the other hand, any number of side-by-side columns and devices of any size can be operated on together because the working range of the bonding head is not extended but merely shifted transversely. Thus, the number of the side-by-side columns can be selected contingent on other demands, e.g., to optimize later processing steps such as the pouring of insulating resin over the frame carrying the bonded devices.

Having thus described at least one illustrative embodiment of the invention, various alterations, modifications, and improvements will readily occur to those skilled in the art. Such alterations, modifications and improvements are intended to be within the spirit and scope of the invention. Accordingly, the foregoing description is by way of example only and is not intended as limiting. The invention is limited only as defined in the following claims and the equivalent thereto.

What is claimed is:

1. A bonding apparatus for forming electric connections between a plurality of predetermined bonding pads on a batch of semiconductor electronic devices and a respective plurality of contact leads formed on a frame on which the batch of semiconductor electronic devices has been arranged, tie bonding apparatus comprising:

a support structure having a work plane with a longitudinal axis;

means for advancing the frame along the longitudinal axis of the work plane;

a bonding head;

a high-precision X-Y table carrying the bonding head and accurately moving the bonding head between a plurality of position settings in the work plane of the support structure; and a carriage supported by the support structure and driven in a guided fashion through a path having at least one directional component that is parallel to the work plane, the X–Y table being mounted to and movable by the carriage.

2. The apparatus of claim 1, wherein the bonding head comprises:
   a tubular bond bit having a feed channel formed therein, the feed channel carrying a bonding wire;
   means for moving the tubular bond bit in a direction that is orthogonal to the work plane, and for pressing the tubular bond bit into engagement with the plurality of bonding pads and the plurality of contact leads; and
   means for imparting ultrasonic vibration to the tubular bond bit.

3. The apparatus of claim 1, wherein the batch of semiconductor electronic devices is arranged on the frame in a plurality of rows and columns.

4. The apparatus of claim 1, wherein each semiconductor electronic device has an area, and wherein the high-precision X–Y table has control means for limiting a working range of the bonding head so that it does not exceed the area of each semiconductor electronic device.

5. The apparatus of claim 1, wherein each semiconductor electronic device has an area, and wherein a working range of the bonding head with respect to the high-precision X–Y table is no greater than the area of each semiconductor electronic device.

6. The apparatus of claim 1, wherein the path includes a plurality of positions spaced from the work plane.

7. The apparatus of claim 6, wherein a line drawn from any of the plurality of positions to the work plane is perpendicular to the work plane.

8. The apparatus of claim 1, wherein the bonding head comprises:
   a tubular bond bit having a feed channel formed therein, the feed channel carrying a bonding wire;
   elevating means for moving the tubular bond bit vertically and for pressing the tubular bond bit into engagement with the plurality of bonding pads and the plurality of contact leads; and
   means for imparting ultrasonic vibration to the tubular bond bit.

9. The apparatus of claim 8, wherein the elevating means includes a swing arm pivoted to the bonding head and movable in a vertical plane, the tubular bond bit being mounted on one end of the swing arm.

10. The apparatus of claim 1, wherein the carriage is suspended from a portion of the support structure overlying the frame.

11. The apparatus of claim 10, wherein each semiconductor electronic device has an area, and wherein a working range of the bonding head with respect to the high-precision X–Y table is no greater than the area of each semiconductor electronic device.

12. The apparatus of claim 10, wherein the X–Y table is suspended from the carriage.

13. The apparatus of claim 12, wherein each semiconductor electronic device has an area, and wherein a working range of the bonding head with respect to the high-precision X–Y table is no greater than the area of each semiconductor electronic device.

14. A bonding apparatus for forming electric connections between a plurality of bonding pads on a batch of semiconductor electronic devices and a respective plurality of contact leads formed on a frame on which the batch of semiconductor electronic devices has been arranged, the frame being movable with respect to the bonding apparatus in a longitudinal direction, the bonding apparatus comprising:
   a base having a work plane in which the frame is movably received;
   a bonding head;
   an X–Y table carrying the bonding head and moving the bonding head between a plurality of position settings in the work plane of the base; and
   means, supported by the base, for moving the X–Y table with respect to the base through a path having at least one directional component that is parallel to the work plane.

15. The apparatus of claim 14, wherein the batch of semiconductor electronic devices is arranged on the frame in a plurality of rows and columns.

16. The apparatus of claim 14, wherein each semiconductor electronic device has an area, and wherein the X–Y table has control means for limiting a working range of the bonding head so that it does not exceed the area of each semiconductor electronic device.

17. The apparatus of claim 14, wherein each semiconductor electronic device has an area, and wherein a working range of the bonding head with respect to the X–Y table is no greater than the area of each semiconductor electronic device.

18. The apparatus of claim 14, wherein the means for moving the X–Y table is suspended from the base above the work plane.

19. The apparatus of claim 14, wherein the path includes a plurality of positions spaced from the work plane.

20. The apparatus of claim 19, wherein a line drawn from any of the plurality of positions to the work plane is perpendicular to the work plane.

21. A bonding apparatus for forming electric connections between a plurality of bonding pads on a batch of semiconductor electronic devices and a respective plurality of contact leads formed on a frame on which the batch of semiconductor electronic devices has been arranged, the frame being movable with respect to the bonding apparatus in a longitudinal direction, the bonding apparatus comprising:
   a base having a work plane in which the frame is movably received;
   a bonding head; and
   an X–Y table carrying the bonding head and moving the bonding head between a plurality of position settings in the work plane of the base, the X–Y table being mounted to the base for movement through a path having at least one directional component that is parallel to the work plane.

22. The apparatus of claim 21, wherein the bonding head comprises:
   a tubular bond bit having a feed channel formed therein, the feed channel carrying a bonding wire;
   means for moving the tubular bond bit in a direction that is orthogonal to the work plane, and for pressing the tubular bond bit into engagement with the plurality of bonding pads and the plurality of contact leads; and means for imparting ultrasonic vibration to the tubular bond bit.

23. The apparatus of claim 21, wherein the batch of semiconductor electronic devices is arranged on the frame in a plurality of rows and columns.

24. The apparatus of claim 21, wherein each semiconductor electronic device has an area, and wherein a working range of the bonding head with respect to the X–Y table is no greater than the area of each semiconductor electronic device.

25. The apparatus of claim 21, wherein the X–Y table is suspended from the base above the frame.

26. The apparatus of claim 25, wherein each semiconductor electronic device has an area, and wherein a working range of the bonding head with respect to the X–Y table is no greater than the area of each semiconductor electronic device.

27. The apparatus of claim 21, wherein the path includes a plurality of positions spaced from the work plane.

28. The apparatus of claim 27, wherein a line drawn from any of the plurality of positions to the work plane is perpendicular to the work plane.

* * * * *